United States Patent
Singh et al.

(10) Patent No.: US 8,671,333 B2
(45) Date of Patent: Mar. 11, 2014

(54) ADAPTIVE ENCODING AND DECODING FOR ERROR PROTECTED PACKET-BASED FRAMES

(75) Inventors: Ravi Kumar Singh, Austin, TX (US); Atul Kisanrao Hedaoo, Bangalore (IN)

(73) Assignee: LSI Corporation, San Jose, CA (US)

( * ) Notice: Subject to any disclaimer, the term of this patent is extended or adjusted under 35 U.S.C. 154(b) by 322 days.

(21) Appl. No.: 13/172,221

(22) Filed: Jun. 29, 2011

(65) Prior Publication Data

US 2013/0007567 A1    Jan. 3, 2013

(51) Int. Cl.
    *H03M 13/00*      (2006.01)

(52) U.S. Cl.
    USPC ............................ 714/776; 714/774; 714/748

(58) Field of Classification Search
    USPC .................................. 714/748, 749, 774, 776
    See application file for complete search history.

(56) References Cited

U.S. PATENT DOCUMENTS

| | | | |
|---|---|---|---|
| 6,141,788 A | 10/2000 | Rosenberg et al. | |
| 6,587,985 B1 * | 7/2003 | Fukushima et al. | 714/748 |
| 7,287,206 B2 * | 10/2007 | Terry et al. | 714/748 |
| 7,903,680 B2 | 3/2011 | Hedaoo et al. | |
| 2007/0253423 A1 * | 11/2007 | Chindapol et al. | 370/394 |
| 2010/0202309 A1 | 8/2010 | Suneya | |

OTHER PUBLICATIONS

Shiozaki, A.; Okuno, K.; Suzuki, K.; Segawa, T., "A hybrid ARQ scheme with adaptive forward error correction for satellite communications," Communications, IEEE Transactions on , vol. 39, No. 4, pp. 482,484, Apr. 1991.*

Hui Zhao; Sato, T.; Kimura, I., "A hybrid-ARQ protocol with optimal adaptive error control for multidestination satellite communications," Singapore ICCS '94. Conference Proceedings. , vol. 2, No., pp. 420,424 vol. 2, Nov. 14-18, 1994.*

J. Rosenberg et al., "An RTP Payload Format for Generic Forward Error Correction," Network Working Group, Request for Comments: 2733, Dec. 1999, pp. 1-25.

* cited by examiner

*Primary Examiner* — Cynthia Britt

(74) *Attorney, Agent, or Firm* — Ryan, Mason & Lewis, LLP

(57) ABSTRACT

A communication system transmitter comprises an adaptive error correction encoder. The adaptive error correction encoder is configured to generate a plurality of error correction frames with each such error correction frame comprising a plurality of data packets and one or more error correction packets. A given one of the error correction packets comprises information relating to the plurality of data packets of its corresponding frame and additional information relating to a different one of the error correction frames. The additional information may be inserted into a header of the given error correction packet, and may comprise a next frame sequence number indicator and a corresponding next frame mask value for a subsequent one of the error correction frames. Other aspects of the invention relate to a communication system receiver comprising an adaptive FEC decoder, adaptive FEC encoding and decoding methods, integrated circuits, and associated computer program products.

21 Claims, 7 Drawing Sheets

ADAPTIVE ENCODING AND DECODING FOR ERROR PROTECTED PACKET-BASED FRAMES

FIELD OF THE INVENTION

The present invention relates generally to communication systems, and more particularly to techniques for providing error protection for packets transmitted over a network in a communication system.

BACKGROUND OF THE INVENTION

Forward error correction (FEC) techniques are commonly used in packet-based networks, such as the Internet, to compensate for packet losses. An exemplary FEC technique suitable for use with real-time media packets employing the real-time transmission protocol (RTP) is described in IETF RFC 2733, "An RTP Payload Format for Generic Forward Error Correction," J. Rosenberg et al., December 1999, which is incorporated by reference herein. In accordance with this technique, an additional packet, called a checksum packet or FEC packet, is added to a media frame, which comprises a block of data packets, before transmission of the frame. At a receiver, a lost data packet of the frame can be recovered by combining the checksum packet with those data packets that were successfully received. More specifically, the lost data packet is recovered by performing mathematical operations, such as exclusive-or (XOR) logic operations, on the checksum packet and the successfully received data packets.

In a conventional arrangement, a received packet is stored in a packet buffer of a receiver for subsequent processing by a FEC decoder of that receiver. The FEC decoder is configured in accordance with the above-cited RFC 2733. The FEC decoder determines whether the media frame to which the received packet belongs is ready for FEC decoding. If not, a subsequent packet is received and stored. If, however, the frame is ready for FEC decoding, the FEC decoder reads the checksum packet and the successfully received data packets for the frame from the packet buffer and performs mathematical operations (e.g., XOR logic operations) on the checksum packet and the successfully received data packets, and then reconstructs the missing packet based on the results of the mathematical operations.

A significant drawback of the above-described conventional arrangement is that the packet buffer is generally configured to store the maximum number of packets that may be present within a given variable-length frame. This is because the mathematical computations associated with missing packet recovery are performed only after all of the received packets associated with a given frame are present in the packet buffer. This unduly increases the required size of the packet buffer, as well as the processing latency associated with missing packet recovery.

SUMMARY OF THE INVENTION

An illustrative embodiment of the invention provides a communication system having a transmitter comprising an adaptive FEC encoder and a receiver comprising an adaptive FEC decoder. The adaptive FEC encoder generates FEC frames each comprising a variable number of data packets and a corresponding FEC packet. As each data packet is received at the receiver, the FEC decoder reads the data packet and performs a FEC operation on that packet, such as an XOR logic operation, without waiting for the entire FEC frame or even any further portion of the FEC frame to be received. The XOR logic operation results are accumulated until sufficient packets are received to reconstruct a missing packet in the current FEC frame. Because the FEC operations are performed for a given data packet immediately after that data packet is received, and without any delay from waiting for subsequent data packets, the receiver has a very low latency, and the packet buffer may be relatively small.

In one aspect, a communication system transmitter comprises an adaptive error correction encoder. The adaptive error correction encoder is configured to generate a plurality of error correction frames with each such error correction frame comprising a plurality of data packets and at least one error correction packet. A given one of the error correction packets comprises information relating to the plurality of data packets of its corresponding frame and additional information relating to a different one of the error correction frames. For example, the additional information relating to the different one of the error correction frames may be inserted into a header of the given error correction packet, and may comprise a next frame sequence number indicator and a corresponding next frame mask value for a subsequent one of the error correction frames.

In another aspect, a communication system receiver comprises an adaptive error correction decoder. The adaptive error correction decoder is configured to process a plurality of error correction frames with each such error correction frame comprising a plurality of data packets and at least one error correction packet to recover at least one additional data packet. A given one of the error correction packets comprises information relating to the plurality of data packets of its corresponding frame and additional information relating to a different one of the error correction frames.

Other aspects of the invention relate to adaptive FEC encoding and decoding methods, transceiver integrated circuits, and associated computer program products.

The illustrative embodiments provide significant reductions in the memory requirements associated with the packet buffer, thereby reducing the cost, complexity and power consumption of the corresponding receiver. Also, processing latency associated with missing packet recovery is substantially reduced.

DETAILED DESCRIPTION OF THE INVENTION

The invention will be illustrated herein in conjunction with exemplary communication systems, transmitters, receivers, associated processing circuitry and error protection techniques. It should be understood, however, that the invention is more generally applicable to other types of communication systems, transmitters and receivers, and may be implemented using other arrangements of circuitry and error protection techniques. For example, the techniques disclosed herein can be adapted in a straightforward manner for use in any communication system in which packet-based frames are subject to error protection processing.

Figure 1:
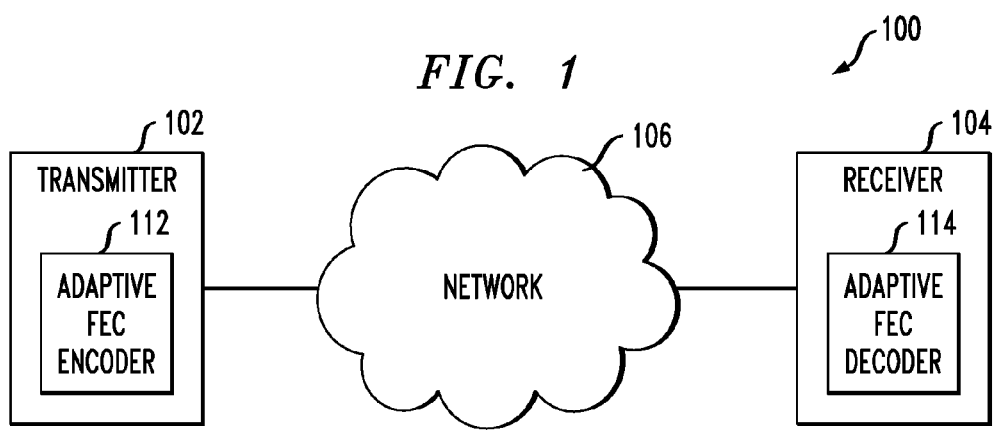
FIG. 1 is a block diagram of a communication system in an illustrative embodiment of the invention.

FIG. 1 shows a communication system 100 in which the present invention is implemented. The system 100 comprises a transmitter 102 which communicates with a receiver 104 over a network 106. The transmitter 102 includes an adaptive FEC encoder 112 and the receiver 104 includes an adaptive FEC decoder 114.

The transmitter 102 and receiver 104 may be associated with respective communication devices or other types of processing devices that transmit and receive packets over the network 106. Such processing devices may comprise, for example, computers, servers, mobile telephones, wireless email devices or other devices, in any combination. A given such processing device may comprise a transceiver that includes both transmitter and receiver functionality. Communication in the system 100 may therefore be bidirectional, although illustrated in only a single direction for the simplified diagram of FIG. 1. Conventional aspects of the operation of transceivers and other processing device components will not be described in detail herein.

The network 104 may comprise any type of packet-based network, including a wide area network such as the Internet, a metropolitan area network, a local area network, a telephony network, a cable network, a satellite network, or other type of packet-based network, as well as portions or combinations of such networks.

Figure 2:
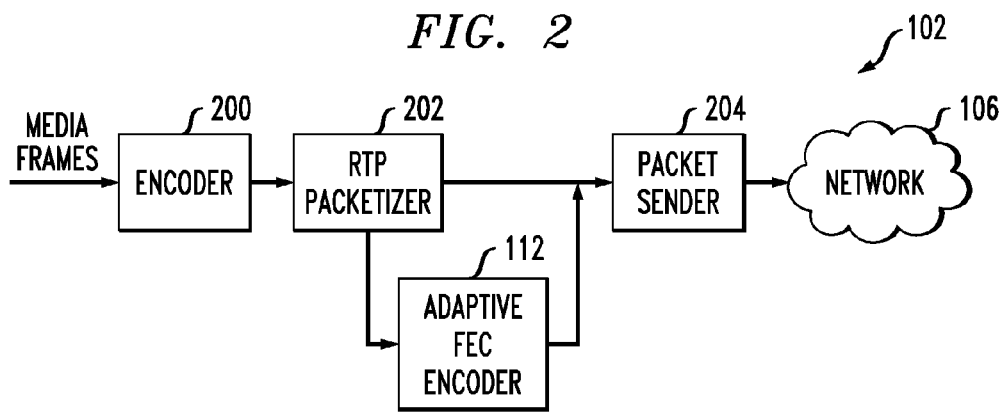
FIG. 2 shows a more detailed view of a transmitter of the FIG. 1 system.
Figure 4:
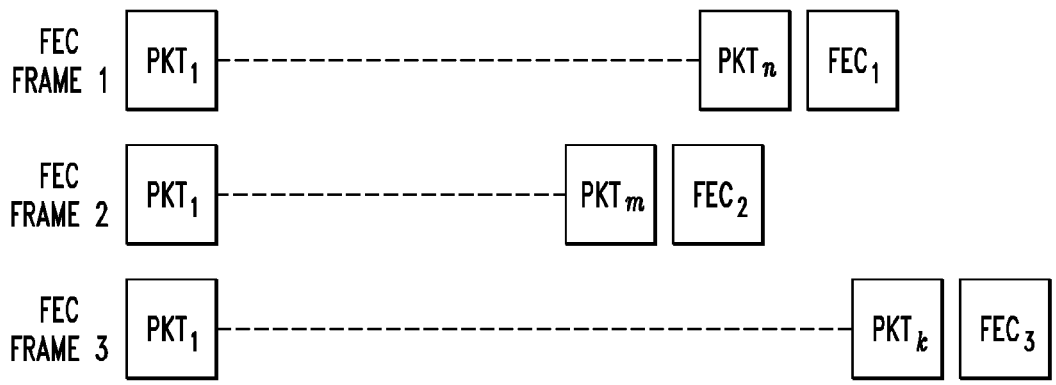
FIG. 4 illustrates variable-length FEC frames processed in the FIG. 1 system.

FIG. 2 shows a more detailed view of the transmitter 102 in the present embodiment. The transmitter includes a source encoder 200 which receives media frames for transmission over the network 106. The encoded frames are applied to an RTP packetizer 202 which generates RTP data packets from the encoded frames. The adaptive FEC encoder 112 processes the data packets of each frame to generate a FEC packet for that frame in a manner to be described in greater detail below. The data packets of a given frame and the corresponding FEC packet are then transmitted over network 106 by a packet sender 204. The given frame of data packets and its associated FEC packet are collectively referred to as herein as a FEC frame, and examples of such FEC frames are illustrated in FIG. 4.

Figure 3:
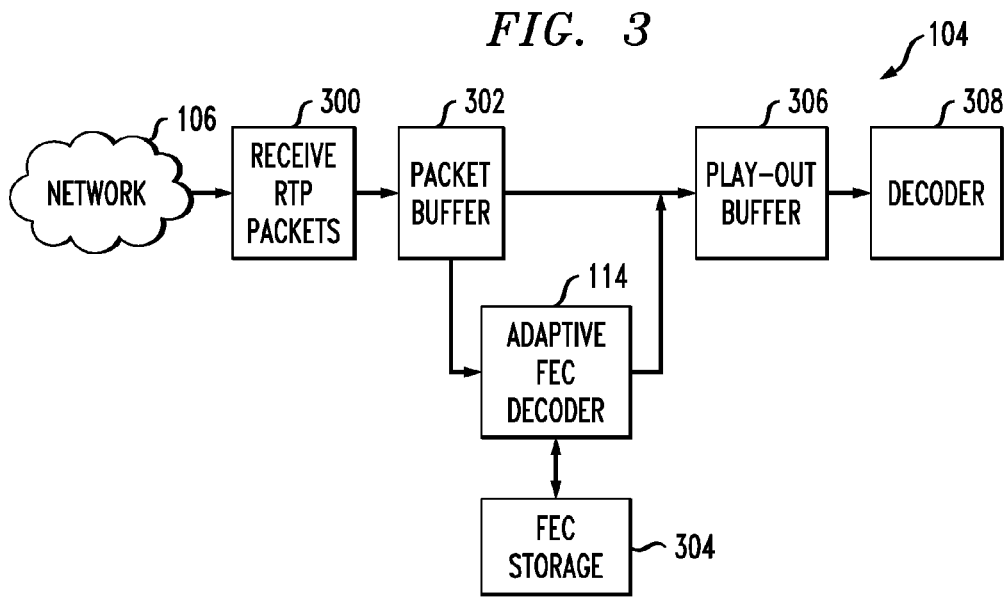
FIG. 3 shows a more detailed view of a receiver of the FIG. 1 system.

The receiver 104 is shown in greater detail in FIG. 3. The packets transmitted over network 106 by the transmitter 102 are received in an RTP packet receive module 300 and stored in a packet buffer 302 that comprises at least one input queue and is accessible to the adaptive FEC decoder 114. The adaptive FEC decoder 114 is also coupled to a FEC storage element 304 as shown, and performs error correction operations using the FEC packets in a manner to be described in greater detail below. Outputs of the packet buffer 302 are coupled to respective inputs of the adaptive FEC decoder 114 and a play-out buffer 306, such that received packets are passed from the packet buffer 302 to the adaptive FEC decoder 114 and the play-out buffer 306. In the adaptive FEC decoder 114, a FEC operation is performed on each of the received packets that is confirmed as belonging to a current frame. The FEC operation will generally comprise at least one XOR logic operation, and may be an XOR logic operation of the type described in the above-cited RFC 2733. The result is stored in an XORed format in FEC storage 304 of receiver 104. Completed frames are passed from the play-out buffer 306 to a source decoder 308.

At least a portion of each of the transmitter 102 and receiver 104 may be implemented using processing circuitry of a corresponding processing device. Such processing circuitry may comprise at least one processor coupled to at least one memory. For example, the processing circuitry may more particularly comprise one or more of a microprocessor, a central processing unit (CPU), a microcontroller and a digital signal processor, and may be arranged in the form of one or more integrated circuits, such as an application-specific integrated circuit (ASIC), a field programmable gate array (FPGA) or other type of integrated circuit, as well as portions or combinations of such integrated circuits.

Accordingly, at least a portion of the transmitter or receiver adaptive FEC functionality described herein may be implemented in the form of software comprising executable code stored in a memory and executed by a processor within the corresponding transmitter or receiver. The memory may therefore store program code that is executed by the processor to implement at least a portion of an adaptive FEC encoding or FEC decoding process carried out by the transmitter or receiver.

A processing device memory of the type described above is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. As indicated above, the processor may comprise a microprocessor, CPU, ASIC, FPGA or other type of processing device, as well as portions or combinations of such devices. It should therefore be apparent that adaptive FEC encoding or decoding techniques in accordance with the present invention may be implemented using various combinations of hardware, software and firmware.

The manner in which adaptive FEC functionality is provided in communication system 100 using adaptive FEC encoder 112 and adaptive FEC decoder 114 will now be described with reference to FIGS. 4 through 10.

Referring initially to FIG. 4, a sequence of FEC frames generated by the transmitter 102 is shown. The FEC frames have a variable length, and each FEC frame comprises a FEC packet which includes a FEC header. More specifically, three different FEC frames are shown, denoted FEC Frame 1, FEC Frame 2 and FEC Frame 3, which include respective FEC packets denoted $FEC_1$, $FEC_2$ and $FEC_3$. Each of the FEC frames shown includes a different number of data packets, and more specifically the FEC frames include n, m and k data packets, respectively. The number of data packets in each FEC frame is therefore variable, rather than predetermined or negotiated between the transmitter and the receiver.

Figure 5:
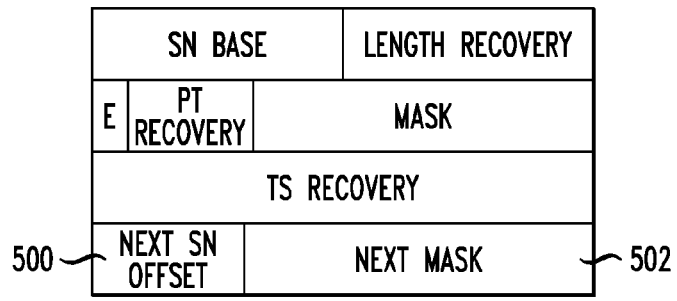
FIGS. 5 and 6 show respective modified and standard FEC headers that may be used in the FEC packets of the FEC frames of FIG. 4.

The FEC packets $FEC_1$, $FEC_2$ and $FEC_3$ are generally constructed by the adaptive FEC encoder 112 in the manner set forth in the above-cited RFC 2733, but in certain embodiments the FEC packets have a modified header that includes additional fields 500 and 502 for next sequence number (SN) offset and next mask, respectively, as illustrated in FIG. 5.

Figure 6:
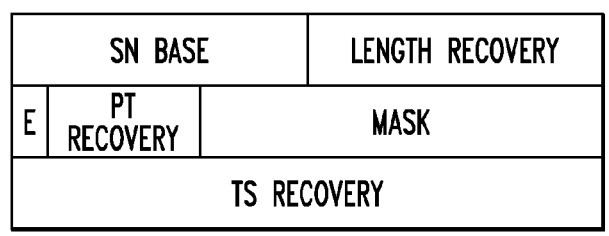

FIG. 5 shows a modified FEC header that may be utilized in generating FEC packets in the adaptive FEC encoder 112 of FIG. 2. The corresponding unmodified header is a 12-byte header as shown in FIG. 6, which is also described in detail in the above-cited RFC 2733. Both the modified header of FIG. 5 and the unmodified header of FIG. 6 each comprise an SN base field, a length recovery field, a header extension (E) field, a payload type (PT) recovery field, a mask field and a timestamp (TS) recovery field.

The SN base field is a 16-bit field that is set to the minimum sequence number of the data packets of the corresponding FEC frame.

The length recovery field is a 16-bit field used to determine the length of any recovered packets. It is obtained via an error protection operation applied to the data packets of the corresponding FEC frame in the adaptive FEC encoder 112.

The E field is a single-bit field that indicates a header extension and is set to zero in the present embodiment.

The PT recovery field is a 7-bit field used to recover payload type values and is obtained via an error protection operation applied to the payload type values of the data packets of the corresponding FEC frame.

The mask field is a 24-bit field used to identify the data packets that are associated with the FEC packet. If bit i in the mask field is set to a logic one value, then the data packet with sequence number N+i is associated with this FEC packet, where N is the value of the SN base field. The least significant bit of the mask field corresponds to i=0, and the most significant to i=23. Thus, in the present embodiment, a given FEC header can be associated with at most 24 data packets. The maximum FEC frame size in the present embodiment is therefore 24 data packets and one FEC packet, although other FEC frame sizes, fields and configurations can be used in other illustrative embodiments.

The TS recovery field is a 32-bit field used to recover timestamps and is obtained via an error protection operation applied to the timestamps of the data packets of the corresponding FEC frame.

As indicated previously, the modified header of FIG. 5 further includes a next SN offset field 500 and a corresponding next mask field 502. These fields of the modified FEC header generally contain information about the next FEC frame, that is, the FEC frame immediately subsequent in time to the current FEC frame. Thus, the adaptive FEC encoder 112 in an embodiment that utilizes the modified FEC header encodes into the header of the FEC packet of the current FEC frame a sequence number offset value and a corresponding mask value that collectively characterize the sequence numbers of the data packets of a subsequent FEC frame. More particularly, the next frame sequence number offset value and the corresponding next frame mask value for the subsequent FEC frame are inserted into the next SN offset field and the next mask field, respectively, of the modified FEC header of the FEC packet of the current frame.

The next SN offset 500 of the modified FEC header of FIG. 5 is a 16-bit field that provides an offset to the lowest sequence number of the next FEC frame. More particularly, the next frame sequence number offset value in combination with the sequence number base value of the current FEC frame determines the lowest sequence number of the data packets of the subsequent error correction frame as follows:

$$SN\_Base\_Next = SN\_Base + Next\_SN\_offset,$$

where SN_Base and Next_SN_offset denote the contents of the respective SN base and next SN offset fields of the FEC header of the current FEC frame. The next frame mask value in the next mask field 502 of the FEC header of the current FEC frame identifies sequence numbers of the remaining data packets of the subsequent FEC frame, relative to the lowest sequence number identified by the next frame sequence number base value SN_Base_Next as determined in accordance with the above equation. The SN_Base_Next value identifies the minimum sequence number of the data packets of the next FEC frame. Like the current frame mask field, the next mask field 500 is a 24-bit field used to identify the data packets that are associated with the next FEC packet. If bit i in the mask field is set to a logic one value, then the data packet with sequence number N+i is associated with this next FEC packet, where N is the SN_Base_Next value. Again, the least significant bit of the mask field corresponds to i=0, and the most significant to i=23, such that a given FEC header can be associated with at most 24 data packets, and the maximum FEC frame size in the present embodiment is therefore 24 data packets and one FEC packet. As mentioned previously, other FEC frame sizes, fields and configurations can be used in other illustrative embodiments.

Figure 7:
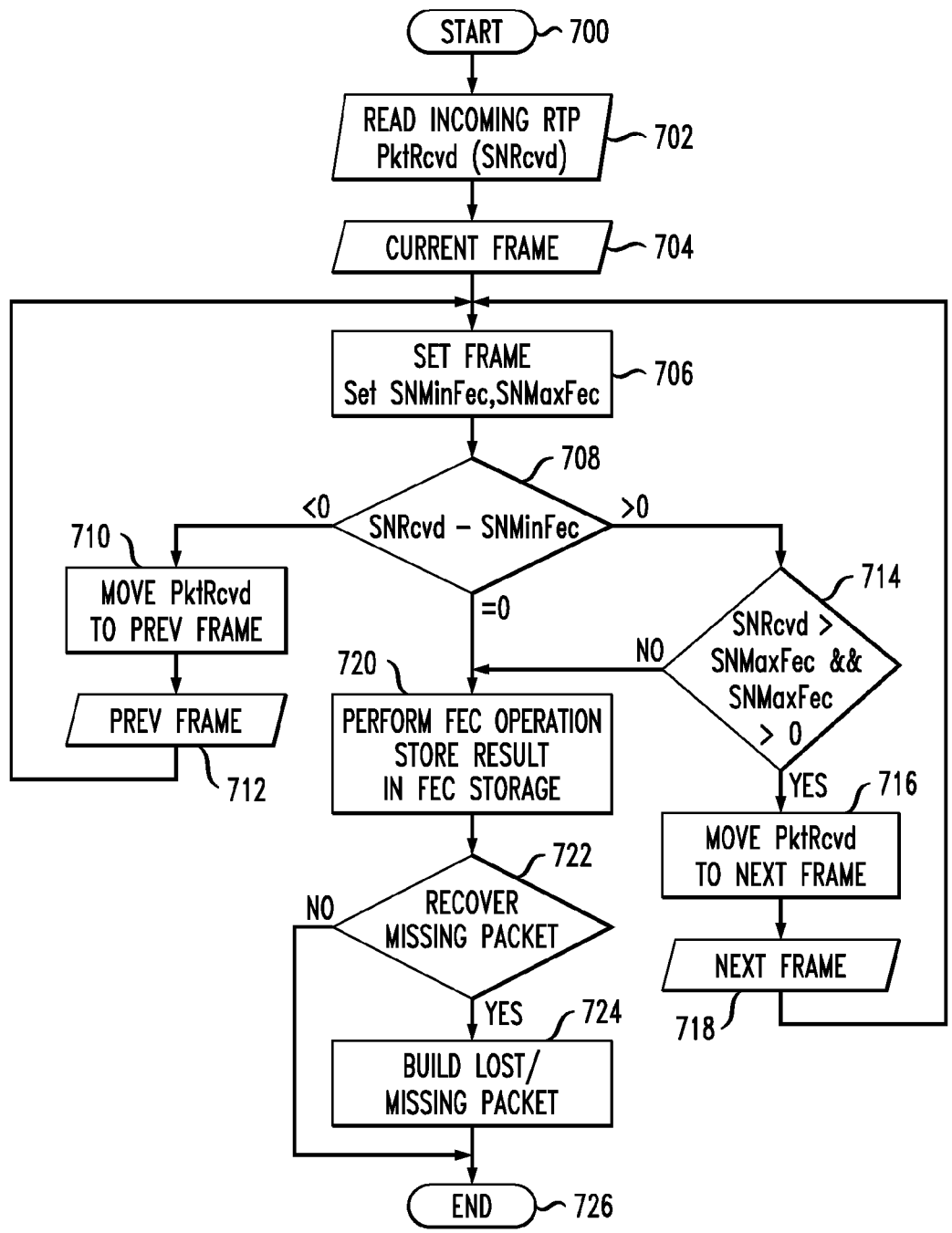
FIGS. 7 through 10 are flow diagrams of processing operations associated with provision of FEC functionality in illustrative embodiments of the invention.
Figure 8:
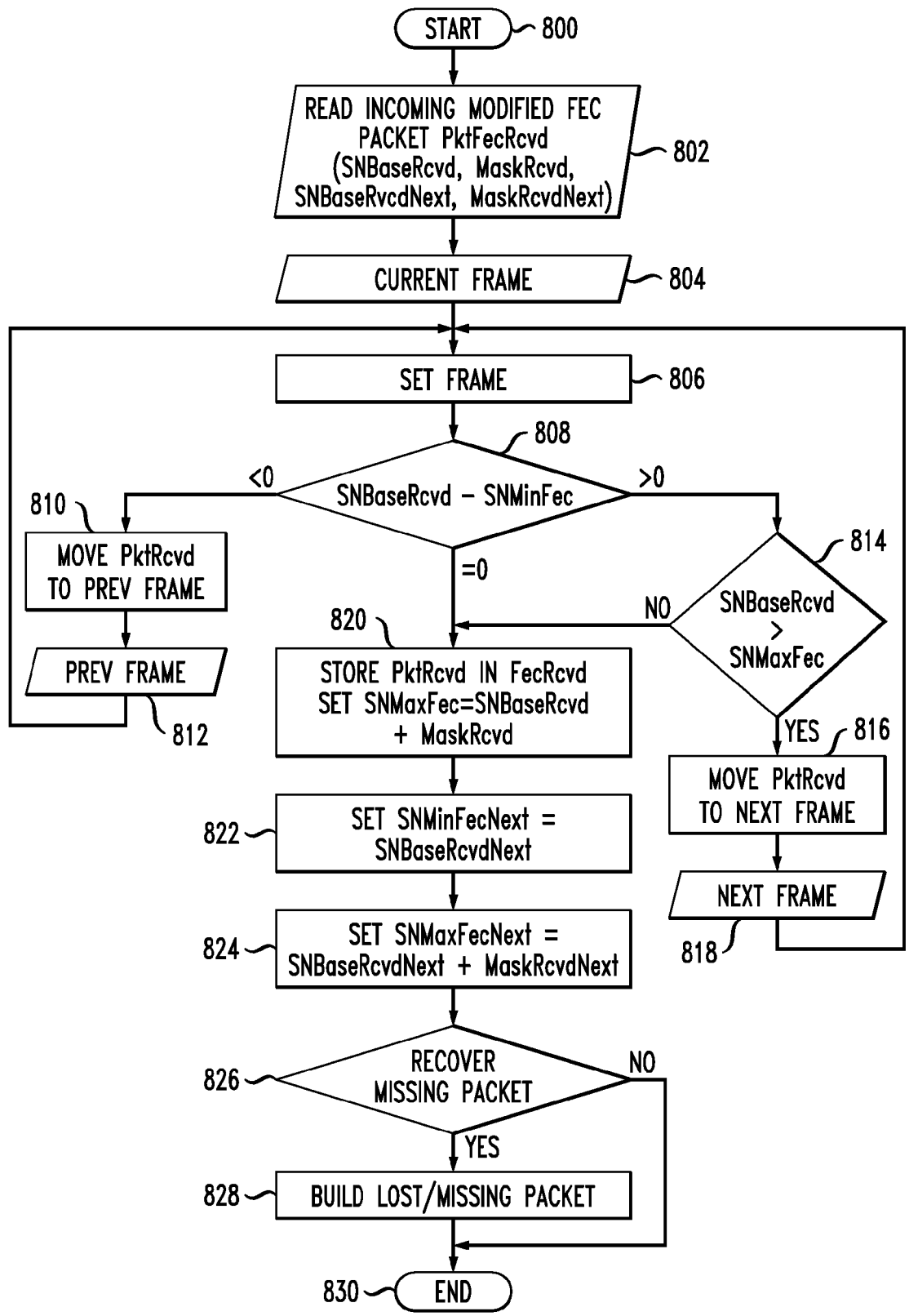
Figure 9:
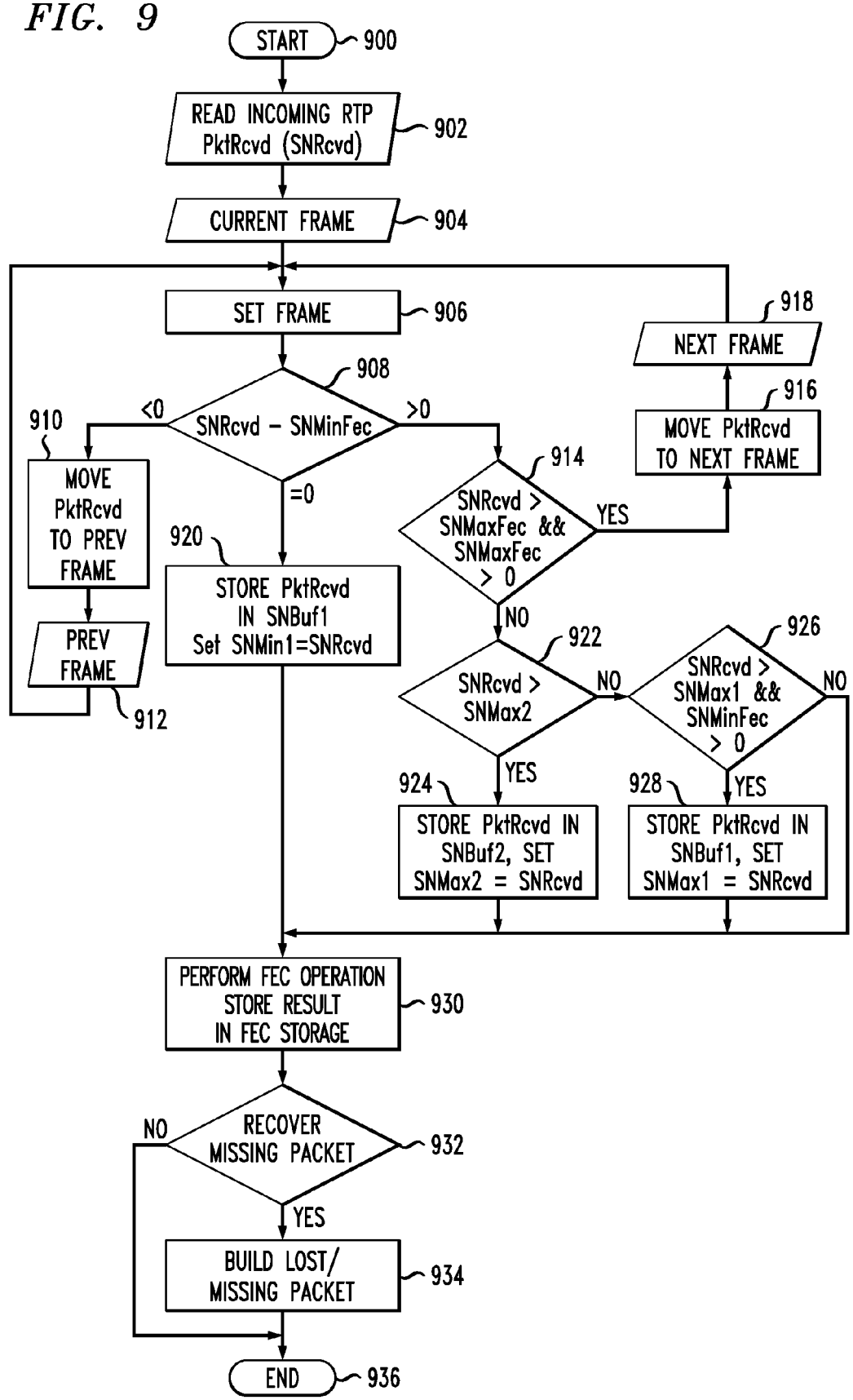
Figure 10:
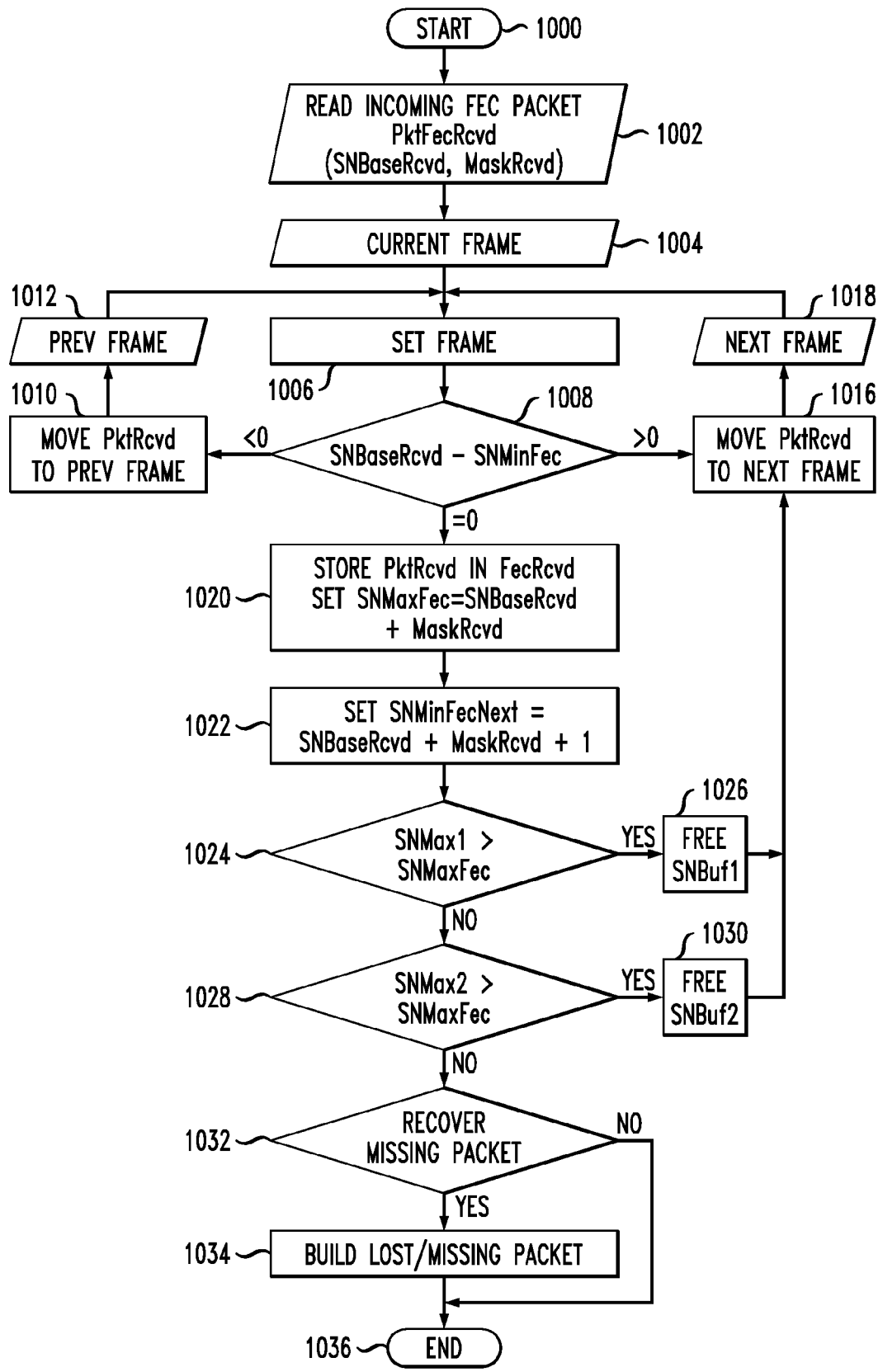

The FEC functionality may be implemented in communication system 100 using the modified FEC header of FIG. 5 or the unmodified FEC header of FIG. 6. The flow diagrams of FIGS. 7 and 8 illustrate processing operations in an embodiment which utilizes the modified FEC header of FIG. 5, and the flow diagrams of FIGS. 9 and 10 illustrate processing operations in an embodiment which utilizes the unmodified FEC header of FIG. 6. It will be assumed without limitation for these embodiments that the data packets protected by the FEC packets are RTP media packets.

The following variables will be used in describing one or more of the flow diagrams of FIGS. 7 through 10.

| | |
|---|---|
| PktRcvd | Received RTP packet |
| PktFecRcvd | Received FEC packet |
| SNRcvd | Sequence number of received RTP packet |
| SNBaseRcvd | Current frame sequence number base value |
| MaskRcvd | Current frame mask value |
| SNBaseRcvdNext | Next frame sequence number base value |
| MaskRcvdNext | Next frame mask value |
| SNMinFec | Minimum sequence number protected by received FEC packet |
| SNMaxFec | Maximum sequence number protected by received FEC packet |

Referring now to FIG. 7, a process for receiving media packets protected by FEC packets having the modified FEC header of FIG. 5 is shown. As noted above, the media packets are assumed to be RTP packets. The process includes steps 700 through 726, and is performed by the receiver 104 of FIG. 3. The process begins in step 700, and an incoming RTP packet is read in step 702.

The received RTP packet is initially assumed to be associated with the current frame in step 704, and is then checked using steps 706 and 708 to determine if it should in fact be associated with the current frame, or instead associated with the previous frame or the next frame. In step 706, the SNMinFec and SNMaxFec values are set for the current frame. Step 708 then determines if the difference between SNRcvd and SNMinFec is negative, zero or positive. If SNRcvd is smaller than SNMinFec, the difference is negative, and the received packet is moved to the previous frame, as indicated in steps 710 and 712. If SNRcvd is equal to SNMinFec, the difference is zero, and the received packet is confirmed as belonging to the current frame. If SNRcvd is greater than SNMinFec, the difference is positive, and the received packet is considered a candidate for movement to the next frame.

A further check is then performed in step 714 to determine if SNRcvd is greater than SNMaxFec, and also that SNMaxFec is greater than zero. If both of these conditions are true, the received packet is moved to the next frame, as indicated in steps 716 and 718. Otherwise, the received packet is confirmed as belonging to the current frame.

In step 720, a FEC operation is performed on the received packet that is confirmed as belonging to the current frame. As indicated previously herein, the FEC operation will generally comprise at least one XOR logic operation, such as an XOR logic operation of the type described in the above-cited RFC 2733, and the result is stored in an XORed format in FEC storage 304 of receiver 104. A determination is made in step 722 as to whether or not a lost or otherwise missing packet can be recovered from the received packets of the current frame. If the lost or otherwise missing packet can be recovered, that packet is reconstructed in step 724, after which the process ends as shown in step 726. Otherwise, step 724 is bypassed and the process ends for the current received packet. The entire process will then repeat for additional incoming packets.

FIG. 8 shows a process for receiving FEC packets having the modified FEC header of FIG. 5. As noted previously, these FEC packets are used to protect the media packets received using the process of FIG. 7. The process includes steps 800 through 830, and is performed by the receiver 104 of FIG. 3. The process begins in step 800, and an incoming FEC packet with a modified header is read in step 802.

The received FEC packet is initially assumed to be associated with the current frame in step 804, and is then checked using steps 806 and 808 to determine if it should in fact be associated with the current frame, or instead associated with the previous frame or the next frame. In step 806, the SNMinFec and SNMaxFec values are set for the current frame. Step 808 then determines if the difference between SNBaseRcvd and SNMinFec is negative, zero or positive. If SNBaseRcvd is smaller than SNMinFec, the difference is negative, and the received FEC packet is moved to the previous frame, as indicated in steps 810 and 812. If SNBaseRcvd is equal to SNMinFec, the difference is zero, and the received FEC packet is confirmed as belonging to the current frame. If SNBaseRcvd is greater than SNMinFec, the difference is positive, and the received FEC packet is considered a candidate for movement to the next frame.

A further check is then performed in step 814 to determine if SNBaseRcvd is greater than SNMaxFec. If this condition is true, the received FEC packet is moved to the next frame, as indicated in steps 816 and 818. Otherwise, the received FEC packet is confirmed as belonging to the current frame.

In step 820, the received FEC packet confirmed as belonging to the current frame is stored in the buffer associated with the current frame and SNMaxFec is set equal to SNBaseRcvd+MaskRcvd. The next frame parameters are then set. More specifically, SNMinFecNext is set equal to SNBaseRcvdNext in step 822, and SNMaxFecNext is set equal to SNBaseRcvdNext+MaskRcvdNext in step 824.

A determination is made in step 826 as to whether or not a lost or otherwise missing packet can be recovered from the received packets of the current frame. If the lost or otherwise missing packet can be recovered, that packet is reconstructed in step 824, after which the process ends as shown in step 830. Otherwise, step 828 is bypassed and the process ends for the current received FEC packet. The entire process will then repeat for additional incoming FEC packets.

The following are additional variables that will be used to describe the flow diagrams of FIGS. 9 and 10.

| | |
|---|---|
| SNMin1 | Minimum sequence number within current window |
| SNMin2 | Next minimum sequence number within current window |
| SNMax1 | Maximum sequence number within current window |
| SNMax2 | Next maximum sequence number within current window |
| SNBuf1 | Media packet with sequence number = SNMin1, if SNMinFec = 0<br>Media packet with sequence number = SNMax1, if SNMinFec > 0 |
| SNBuf2 | Media packet with sequence number = SNMax2 |

Referring now to FIG. 9, a process for receiving media packets protected by FEC packets having the unmodified FEC header of FIG. 6 is shown. As noted above, the media packets are assumed to be RTP packets. The process includes steps 900 through 936, and is performed by the receiver 104 of FIG. 3. The process begins in step 900, and an incoming RTP packet is read in step 902.

The received RTP packet is initially assumed to be associated with the current frame in step 904, and is then checked using steps 906 and 908 to determine if it should in fact be associated with the current frame, or instead associated with the previous frame or the next frame. In step 906, the SNMinFec and SNMaxFec values are set for the current frame. Step 908 then determines if the difference between SNRcvd and SNMinFec is negative, zero or positive. If SNRcvd is smaller than SNMinFec, the difference is negative, and the received packet is moved to the previous frame, as indicated in steps 910 and 912. If SNRcvd is equal to SNMinFec, the difference is zero, and the received packet is confirmed as belonging to the current frame. The process then moves to step 920, in which the received packet confirmed as belonging to the current frame is stored as SNBuf1 and SNMin1 is set equal to SNRcvd.

If it is instead determined in step 908 that SNRcvd is greater than SNMinFec, the difference is positive, and the received packet is considered a candidate for movement to the next frame. In this case, a further check is then performed in step 914 to determine if SNRcvd is greater than SNMaxFec, and also that SNMaxFec is greater than zero. If both of these conditions are true, the received packet is moved to the next frame, as indicated in steps 916 and 918. Otherwise, the received packet is confirmed as belonging to the current frame, and subject to further testing as indicated in step 922. More particularly, it is determined in step 922 whether SNRcvd is greater than SNMax2. If this condition is true, the received packet confirmed as belonging to the current frame is stored as SNBuf2 and SNMax2 is set equal to SNRcvd, as indicated in step 924. Otherwise, a further check is made in step 926 to determine if SNRcvd is greater than SNMax1, and also that SNMinFec is greater than zero. If both of these conditions are true, the received packet is stored as SNBuf1 and SNMax1 is set equal to SNRcvd, as indicated in step 928, and if not, the process moves to step 930 as shown.

In step 930, a FEC operation is performed on the received packet that is confirmed as belonging the current frame. As in the FIG. 7 embodiment, the FEC operation performed in step 930 will generally comprise one or more XOR logic operations. The result is stored in an XORed format in FEC storage 304 of receiver 104. A determination is made in step 932 as to whether or not a lost or otherwise missing packet can be recovered from the received packets of the current frame. If the lost or otherwise missing packet can be recovered, that packet is reconstructed in step 934, after which the process ends as shown in step 936. Otherwise, step 934 is bypassed and the process ends for the current received packet. The entire process will then repeat for additional incoming packets.

FIG. 10 shows a process for receiving FEC packets having the unmodified FEC header of FIG. 6. As noted previously, these FEC packets are used to protect the media packets received using the process of FIG. 9. The process includes steps 1000 through 1036, and is performed by the receiver 104 of FIG. 3. The process begins in step 1000, and an incoming FEC packet with a modified header is read in step 1002.

The received FEC packet is initially assumed to be associated with the current frame in step 1004, and is then checked using steps 1006 and 1008 to determine if it should in fact be associated with the current frame, or instead associated with the previous frame or the next frame. In step 1006, the SNMinFec and SNMaxFec values are set for the current frame. Step 1008 then determines if the difference between SNBaseRcvd and SNMinFec is negative, zero or positive. If SNBaseRcvd is smaller than SNMinFec, the difference is negative, and the received FEC packet is moved to the previous frame, as indicated in steps 1010 and 1012. If SNBaseRcvd is equal to SNMinFec, the difference is zero, and the received FEC packet is confirmed as belonging to the current frame. If SNBaseRcvd is greater than SNMinFec, the difference is positive, and the received FEC packet is moved to the next frame, as indicated in step 1016 and 1018.

In step 1020, the received FEC packet confirmed as belonging to the current frame is stored in the buffer associated with the current frame and SNMaxFec is set equal to SNBaseRcvd+MaskRcvd. The next frame parameters are then set. More specifically, SNMinFecNext is set equal to SNBaseRcvd+MaskRcvd+1 in step 1022.

In step 1024, a determination is made as to whether or not SNMaxl is greater than SNMaxFec. If the condition is true, SNBuf1 is freed in step 1026, and the process moves to step 1016. If the condition is not true, a determination is made in step 1028 as to whether or not SNMax2 is greater than SNMaxFec. If this condition is true, SNBuf2 is freed in step 1030, and the process moves to step 1016, and otherwise the process moves to step 1032 as shown.

In step 1032, a determination is made as to whether or not a lost or otherwise missing packet can be recovered from the received packets of the current frame. If the lost or otherwise missing packet can be recovered, that packet is reconstructed in step 1034, after which the process ends as shown in step 1036. Otherwise, step 1034 is bypassed and the process ends for the current received FEC packet. The entire process will then repeat for additional incoming FEC packets.

It is to be appreciated that the particular process steps shown in FIGS. 7 through 10 are presented by way of illustrative example only, and may be varied in other embodiments. Also, as indicated previously, the adaptive FEC encoder 112 and adaptive FEC decoder 114 of system 100 may be configured to support other error correction arrangements than those expressly described above.

Illustrative embodiments of the invention as described above provide a number of significant advantages over conventional techniques. For example, these embodiments provide significant reductions in the memory requirements associated with the packet buffer, thereby reducing the cost, complexity and power consumption of the corresponding receiver. Also, processing latency associated with missing packet recovery is substantially reduced. More specifically, as described in detail in conjunction with the flow diagrams of FIGS. 7 through 10, after a given media packet is received, the FEC decoder reads the media packet and performs a FEC operation on that packet, such as an XOR logic operation, without waiting for the entire frame or even any further portion of the frame to be received. The XOR logic operation results are accumulated until sufficient packets are received to reconstruct a missing packet in the current frame. Because the FEC operations are performed for a given packet immediately after that packet is received, and without any delay from waiting for subsequent packets, the receiver has a very low latency, and the packet buffer may be relatively small.

Components of communication system 100 such as transmitter 102 with adaptive FEC encoder 112 or receiver 104 with adaptive FEC decoder 114 may be implemented in the form of one or more integrated circuit devices suitable for installation on a circuit board, circuit card or other mounting structure of an otherwise conventional communication device or other type of processing device.

Figure 11:
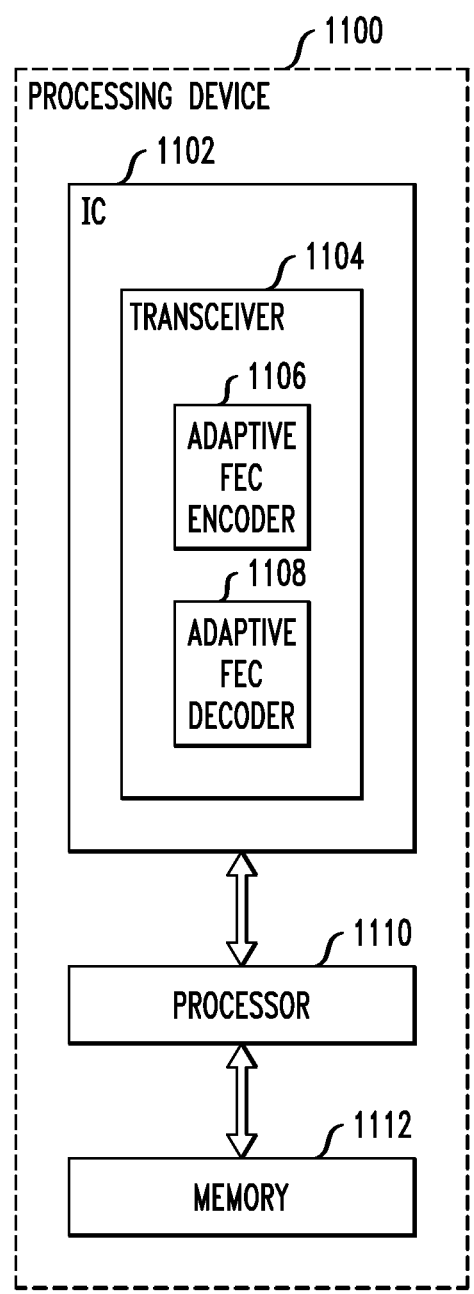
FIG. 11 is a block diagram of a processing device comprising a transceiver integrated circuit with adaptive FEC functionality in an illustrative embodiment of the invention.

FIG. 11 shows an example of an arrangement of this type. In this embodiment, a processing device 1100 comprises an integrated circuit 1102 which implements a transceiver 1104. The transceiver comprises both a transmitter having an adaptive FEC encoder 1106 and a receiver having an adaptive FEC decoder 1108. The processing device also includes a processor 1110 coupled to a memory 1112. Other integrated circuit implementations may incorporate at least a portion of the processor 1110 or memory 1112 into the integrated circuit 1102 that comprises transceiver 1104.

In a given such integrated circuit implementation, identical die are typically formed in a repeated pattern on a surface of a semiconductor wafer. Each die includes at least a portion of an adaptive FEC encoder or decoder as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It should again be emphasized that the particular exemplary communication system configurations shown in FIGS. 1-3 and 11, the FEC frame and header arrangements shown in FIGS. 4-6, and the processing operations shown in FIGS. 7-10, may be varied in other embodiments. For example, different types and arrangements of transmitter and receiver circuitry may be used to implement FEC encoding and decoding functionality of the type described herein. These and numerous other alternative embodiments within the scope of the following claims will be readily apparent to those skilled in the art.

What is claimed is:

1. An apparatus comprising:
   a transmitter comprising an adaptive error correction encoder;
   wherein the adaptive error correction encoder is configured to generate a plurality of error correction frames with each such error correction frame comprising a plurality of data packets and one or more error correction packets; and
   wherein a given one of the error correction packets comprises information relating to the plurality of data packets of its corresponding frame and additional information relating to a different one of the error correction frames.

2. The apparatus of claim 1 wherein the additional information relating to the different one of the error correction frames is inserted into a header of the given error correction packet.

3. The apparatus of claim 1 wherein the additional information comprises a next frame sequence number indicator and a corresponding next frame mask value for a subsequent one of the error correction frames.

4. The apparatus of claim 3 wherein the next frame sequence number indicator and the corresponding next frame mask value for the subsequent one of the error correction frames are inserted into a next frame sequence number indicator field and a next frame mask field, respectively, of the header of the given error correction packet.

5. The apparatus of claim 3 wherein the next frame sequence number indicator comprises a next frame sequence number offset value that in combination with a sequence number base value of a current one of the error correction frames identifies a lowest sequence number of a plurality of data packets of the subsequent error correction frame.

6. The apparatus of claim 5 wherein the next frame mask field identifies sequence numbers of remaining ones of the plurality of data packets of the subsequent error correction frame, relative to the lowest sequence number identified by the next frame sequence number offset value in combination with the sequence number base value.

7. An integrated circuit comprising the apparatus of claim 1.

8. The apparatus of claim 1 wherein the additional information relates to a subsequent one of the error correction frames relative to the error correction frame corresponding to the given error correction packet.

9. A method comprising:
generating a plurality of error correction frames with each such error correction frame comprising a plurality of data packets and one or more error correction packets; and
transmitting the error correction frames;
wherein a given one of the error correction packets comprises information relating to the plurality of data packets of its corresponding frame and additional information relating to a different one of the error correction frames.

10. The method of claim 9 wherein the additional information relating to the different one of the error correction frames is inserted into a header of the given error correction packet.

11. The method of claim 9 wherein the additional information comprises a next frame sequence number indicator and a corresponding next frame mask value for a subsequent one of the error correction frames.

12. The method of claim 11 wherein the next frame sequence number indicator and the corresponding next frame mask value for the subsequent one of the error correction frames are inserted into a next frame sequence number indicator field and a next frame mask field, respectively, of the header of the given error correction packet.

13. A non-transitory computer-readable medium having computer program code embodied therein, wherein the computer program code when executed in a transmitter causes the transmitter to perform the steps of the method of claim 9.

14. An apparatus comprising:
a receiver comprising an adaptive error correction decoder;
wherein the adaptive error correction decoder is configured to process a plurality of error correction frames, with each such error correction frame comprising a plurality of data packets and one or more error correction packets, to recover at least one additional data packet; and
wherein a given one of the error correction packets comprises information relating to the plurality of data packets of its corresponding frame and additional information relating to a different one of the error correction frames.

15. The apparatus of claim 14 wherein the additional information relating to the different one of the error correction frames is extracted from a header of the given error correction packet.

16. The apparatus of claim 14 wherein the additional information comprises a next frame sequence number indicator and a corresponding next frame mask value for a subsequent one of the error correction frames.

17. An integrated circuit comprising the apparatus of claim 14.

18. A method comprising:
receiving a plurality of error correction frames with each such error correction frame comprising a plurality of data packets and one or more error correction packets; and
processing the error correction frames to recover at least one additional data packet;
wherein a given one of the error correction packets comprises information relating to the plurality of data packets of its corresponding frame and additional information relating to a different one of the error correction frames.

19. The method of claim 18 wherein the processing step further comprises:
reading one of the data packets; and
performing a FEC operation on that data packet prior to receiving one or more subsequent data packets of the corresponding frame.

20. The method of claim 18 wherein the processing step further comprises:
accumulating results of FEC operations performed on respective ones of the data packets of the corresponding frame as said data packets are received; and
reconstructing the additional data packet based on the accumulated results of the FEC operations.

21. A non-transitory computer-readable medium having computer program code embodied therein, wherein the computer program code when executed in a receiver causes the receiver to perform the steps of the method of claim 18.

* * * * *